(12) United States Patent
Chen et al.

(10) Patent No.: US 9,256,336 B2
(45) Date of Patent: Feb. 9, 2016

(54) CAPACITIVE TOUCH SENSOR STRUCTURE AND APPLICATIONS THEREOF

(71) Applicant: AU OPTRONICS CORP., Hsin-Chu (TW)

(72) Inventors: Kuan-Yu Chen, Hsin-Chu (TW);
Yu-Feng Chien, Hsin-Chu (TW);
Seok-Lyul Lee, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/624,849

(22) Filed: Feb. 18, 2015

(65) Prior Publication Data
US 2015/0169112 A1 Jun. 18, 2015

Related U.S. Application Data

(62) Division of application No. 13/903,248, filed on May 28, 2013, now Pat. No. 9,001,077.

(30) Foreign Application Priority Data

Sep. 21, 2012 (TW) .............................. 101134877 A

(51) Int. Cl.
*G06F 3/044* (2006.01)
*H03K 17/96* (2006.01)
*G06F 3/041* (2006.01)
*G06F 1/16* (2006.01)

(52) U.S. Cl.
CPC *G06F 3/044* (2013.01); *G06F 1/16* (2013.01); *G06F 3/0412* (2013.01); *H03K 17/962* (2013.01); *H03K 17/9622* (2013.01); *G06F 2203/04112* (2013.01); *H03K 2017/9613* (2013.01); *H03K 2217/94094* (2013.01); *H03K 2217/960775* (2013.01)

(58) Field of Classification Search
CPC .. G06F 3/044; G06F 1/16; G06F 2203/04112
See application file for complete search history.

(56) References Cited

U.S. PATENT DOCUMENTS 7,663,607 B2 2/2010 Hotelling et al.
8,194,047 B2 6/2012 Hsieh et al.
8,355,101 B2 1/2013 Wada
(Continued)

FOREIGN PATENT DOCUMENTS

| CN | 101639580 | 2/2010 |
| CN | 101814256 | 8/2010 |
| TW | M415363 | 11/2011 |

OTHER PUBLICATIONS

China Patent Office, "Office Action", Apr. 1, 2015.

*Primary Examiner* — Fred Tzeng
(74) *Attorney, Agent, or Firm* — WPAT, PC; Justin King

(57) ABSTRACT

A capacitive touch sensor structure comprises a substrate, a first transmissive electrode, a first wire, a first receiving electrode and a second wire. The first transmissive electrode is disposed on the substrate and has at least one first electrode. The first wire is disposed on the substrate and connects to the first electrode of the first transmissive electrode. The first receiving electrode is disposed on the substrate and has at least one second electrode. The second wire is disposed on the substrate and extends along a first direction to connect to the first receiving electrode. The first electrode has a plurality of first slits and the second electrode has a plurality of second slits.

12 Claims, 5 Drawing Sheets

(56) References Cited

U.S. PATENT DOCUMENTS

| | | |
|---|---|---|
| 8,537,297 B2 | 9/2013 | Yamaguchi et al. |
| 2006/0098144 A1 | 5/2006 | Chang et al. |
| 2007/0070273 A1 | 3/2007 | Yoshida et al. |
| 2008/0100785 A1 | 5/2008 | Igeta et al. |
| 2009/0033813 A1 | 2/2009 | Fan Jiang et al. |
| 2009/0066895 A1 | 3/2009 | Kuo et al. |
| 2009/0085885 A1 | 4/2009 | Wu et al. |
| 2009/0179871 A1* | 7/2009 | Tatehata ............... G06F 3/044 345/174 |
| 2009/0315859 A1 | 12/2009 | Chien et al. |
| 2010/0026661 A1 | 2/2010 | Teramoto |
| 2010/0127415 A1 | 5/2010 | Kim et al. |
| 2010/0194710 A1 | 8/2010 | Koito et al. |
| 2010/0214262 A1 | 8/2010 | Ishizaki et al. |
| 2010/0259714 A1 | 10/2010 | Liu et al. |
| 2010/0289774 A1 | 11/2010 | Pan et al. |
| 2011/0169722 A1 | 7/2011 | Ogawa et al. |
| 2011/0279398 A1* | 11/2011 | Philipp ................. G06F 3/044 345/174 |
| 2011/0310459 A1* | 12/2011 | Gates ................... G06F 3/0412 359/296 |
| 2012/0019450 A1 | 1/2012 | Huang et al. |
| 2012/0026122 A1* | 2/2012 | Simmons ............... G06F 3/044 345/174 |
| 2012/0032916 A1* | 2/2012 | Enoki .................... G06F 3/044 345/174 |
| 2012/0056664 A1 | 3/2012 | Nam |
| 2012/0098782 A1 | 4/2012 | Nam |
| 2012/0229420 A1* | 9/2012 | Liu ........................ G06F 3/041 345/174 |
| 2012/0249452 A1* | 10/2012 | Kitano .................. G06F 3/044 345/173 |
| 2012/0306565 A1 | 12/2012 | Hsu |
| 2012/0325639 A1* | 12/2012 | Scuderi ................. G06F 3/044 200/600 |
| 2013/0088667 A1 | 4/2013 | Kong et al. |
| 2013/0278528 A1 | 10/2013 | Ishizaki et al. |

* cited by examiner

CAPACITIVE TOUCH SENSOR STRUCTURE AND APPLICATIONS THEREOF

CROSS-REFERENCE TO RELATED APPLICATION

This application is a divisional of an application Ser. No. 13/903,248, filed on May 28, 2013, and now pending. The entirety of each of the above-mentioned patent applications is hereby incorporated by reference herein and made a part of this specification.

TECHNICAL FIELD

The present disclosure relates to a touch sensor structure and the applications thereof, and more particularly to a capacitive touch sensor structure and the applications thereof.

BACKGROUND OF RELATED ART

As information technology, wireless communication technology, and household electrical appliances continue to develop, touch panels are widely applied to various types of electrical apparatus, such as mobile phone, notebooks, personal digital assistant (PDA) and plane computer, to take the place of traditional keyboards and mouse serving as the main input devices of the electrical apparatus.

A touch panels that has advantages of light weight, high sensitivity, high luminance, low power consumption, abrasion and impact resistance, need no calibration, and supporting multi-point control interaction has become an essential component of a small size display panel adopted by a portable electrical apparatus, such as a mobile phone, a notebook, a personal digital assistant, or a planet computer.

However, there are drawbacks and problems of process complexity and high cost in fabricating a capacitive touch sensor array as well as problems of low and uneven transmittance which may adversely affect the display performance and manipulation of the capacitive touch sensor.

Therefore, there is a need of providing an improved capacitive touch sensor structure and the applications thereof to obviate the drawbacks encountered from the prior art.

SUMMARY

In accordance with one aspect, the present disclosure provides a capacitive touch sensor structure comprising a substrate, a first transmissive electrode, a first wire, a first receiving electrode and a second wire. The first transmissive electrode is disposed on the substrate and has at least one first electrode. The first wire is disposed on the substrate and connects to the first electrode of the first transmissive electrode. The first receiving electrode is disposed on the substrate and has at least one second electrode. The second wire is disposed on the substrate and extends along a first direction to connect to the first receiving electrode. The first electrode has a plurality of first slits and the second electrode has a plurality of second slits.

In one embodiment of the present disclosure, the first wire further comprises the first slits, and the second electrode further comprises the second slits.

In one embodiment of the present disclosure, each of the first slits and each of the second slits have a substantially the same width.

In one embodiment of the present disclosure, the substantially the same width of the first slits and the second slits is greater than 0 μm and substantially equal to or less than 10 μm.

In one embodiment of the present disclosure, the first transmissive electrode has a plurality of the first electrodes connected to the first wire.

In one embodiment of the present disclosure, the plurality of the first electrodes and the at least one second electrode are arranged in a staggered configuration.

In one embodiment of the present disclosure, the capacitive touch sensor structure further comprises a second receiving electrode and a third wire, wherein the second receiving electrode is disposed on the substrate and has at least one third electrode; neither the second receiving electrode nor the first transmissive electrode is in contact with the first receiving electrode; the third wire is disposed on the substrate and extends along the first direction to connect to the second receiving electrode; the second wire is separated from the third wire by a distance; and neither the first wire nor the second wire is in contact with the third wire.

In one embodiment of the present disclosure, both of the third wire and the second wire further comprise the second slits respectively.

In one embodiment of the present disclosure, the distance separating the second wire and the third wire is substantially equal to the substantially the same width of the first slits and the second slits.

In one embodiment of the present disclosure, the distance separating the second wire and the third wire is greater than 0 μm and substantially equal to or less than 10 μm.

In accordance with yet another aspect, the present disclosure provides a capacitive touch panel comprising a display unit and a capacitive touch sensor structure, wherein the display unit has a plurality of sub-pixels; and the capacitive touch sensor structure overlaps with the display unit. The capacitive touch sensor structure comprising a substrate, a first transmissive electrode, a first wire, a first receiving electrode and a second wire. The first transmissive electrode is disposed on the substrate and has at least one first electrode having a plurality of first slits to form a first stripe pattern in the first electrode. The first wire is disposed on the substrate and connects to the first electrode of the first transmissive electrode. The first receiving electrode is disposed on the substrate and has at least one second electrode having a plurality of second slits to form a second stripe pattern in the second electrode. The second wire is disposed on the substrate and extends along a first direction to connect to the first receiving electrode. The first stripe pattern and the second stripe pattern that are overlapped with one of the sub-pixels have a substantially the same area.

In one embodiment of the present disclosure, the first wire further comprises the first slits to form the first stripe pattern therein, and the second wire further comprises the second slits to form the second stripe pattern therein.

In one embodiment of the present disclosure, the stripe pattern of the first wire and the stripe pattern of the second wire that are overlapped with one of the sub-pixels has a substantially the same area.

In one embodiment of the present disclosure, each of the slits of the first wire and each of the slits of the second wire have a substantially the same width.

In one embodiment of the present disclosure, the substantially the same width of the slits of the first wire and the slits of the second wire is greater than 0 μm and substantially equal to or less than 10 μm.

In one embodiment of the present disclosure, the first transmissive electrode has plural the first electrodes connected with the first wire.

In one embodiment of the present disclosure, the plural first electrodes and the at least one second electrode are arranged in a staggered configuration.

In one embodiment of the present disclosure, the capacitive touch panel further comprises a second receiving electrode and a third wire, wherein the second receiving electrode is disposed on the substrate and has at least one third electrode; neither the second receiving electrode nor the first transmissive electrode is in contact with the first receiving electrode; the third wire is disposed on the substrate and extends along the first direction to connect to the second receiving electrode; the second wire is separated from the third wire by a distance; and neither the first wire nor the second wire is in contact with the third wire.

In one embodiment of the present disclosure, both of the second receiving electrode and the third wire have the second slits to form the second stripe pattern thereon respectively.

In one embodiment of the present disclosure, the first stripe pattern and the second stripe pattern that are overlapped with one of the sub-pixels has the substantially the same area.

In one embodiment of the present disclosure, the distance separating the second wire and the third wire is substantially equal to the substantially the same width of the first slits and the second slits.

In one embodiment of the present disclosure, the distance separating the second wire and the third wire is greater than 0 μm and substantially equal to or less than 10 μm.

In accordance with the aforementioned embodiments of the present disclosure, a capacitive touch sensor structure comprising a substrate, a first transmissive electrode, a first wire connected to the first transmissive electrode, a first receiving electrode and a second wire connected to the first receiving electrode is provided, wherein the first transmissive electrode, the first receiving electrode, the first wire and the second wire are preferably formed by the same patterned indium tin oxide (ITO) layer.

A plurality of first slits and a plurality of second slits extending along a direction parallel to the second wire are respectively formed in the first transmissive electrode and the first receiving electrode to form a stripe pattern with a regular interval, whereby a special visual effect is resulted from the first slits and the second slits both parallel to the second wire to make the user ignoring the contours or the residue shadows of the first transmissive electrode and the first receiving electrode. Such that the problems of uneven transmittance due to the contours or the residue shadows of the first transmissive electrode and the first receiving electrode can be obviate, and the display performance of the electrical apparatus applying the capacitive touch sensor structure can be significantly improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

A capacitive touch sensor structure and the applications thereof are provided by the present disclosure to solve the problems of uneven transmittance due to the contours or the residue shadow of the electrodes and wires and to improve the display performance of electrical apparatuses applying the capacitive touch sensor structure. The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
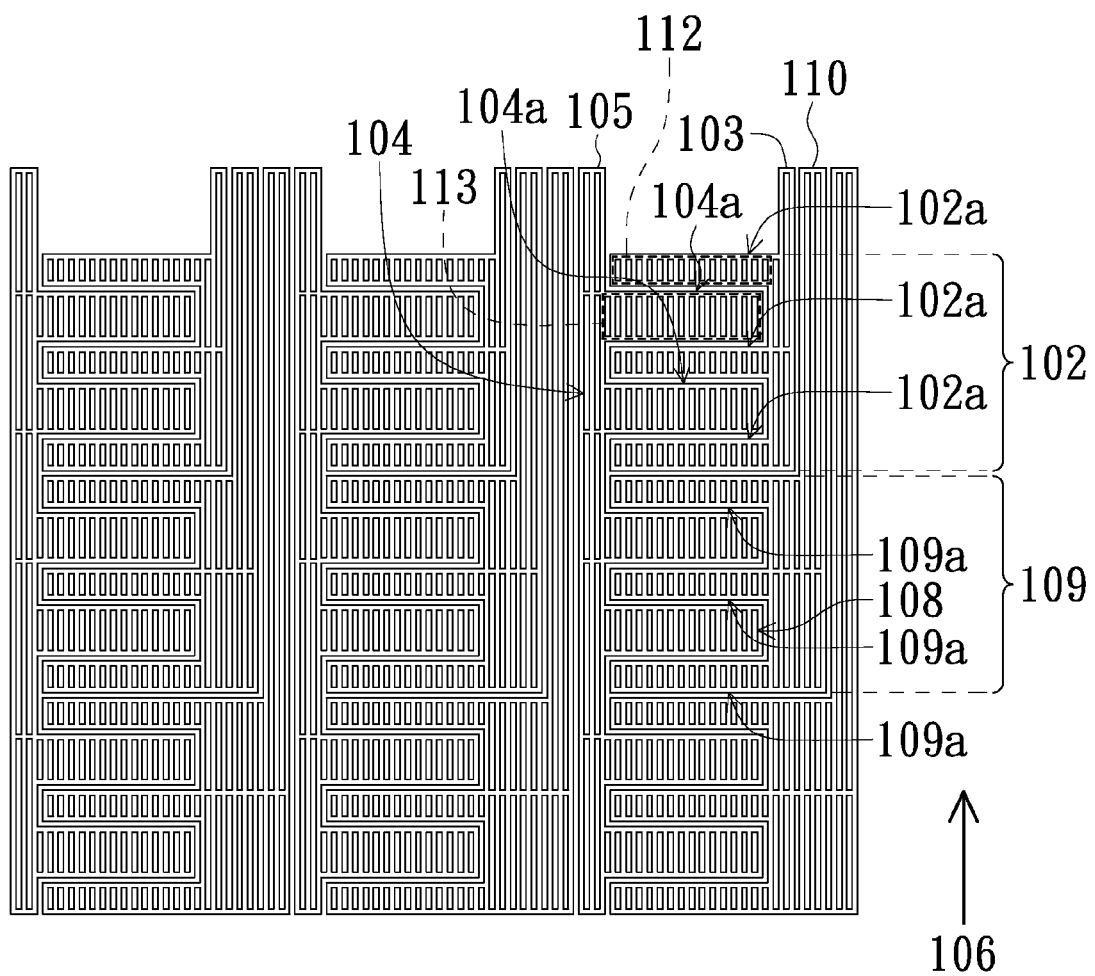
FIG. 1A is a partial top-view illustrating a portion of a capacitive touch sensor structure in accordance with one embodiment of the present disclosure.
Figure 1B:
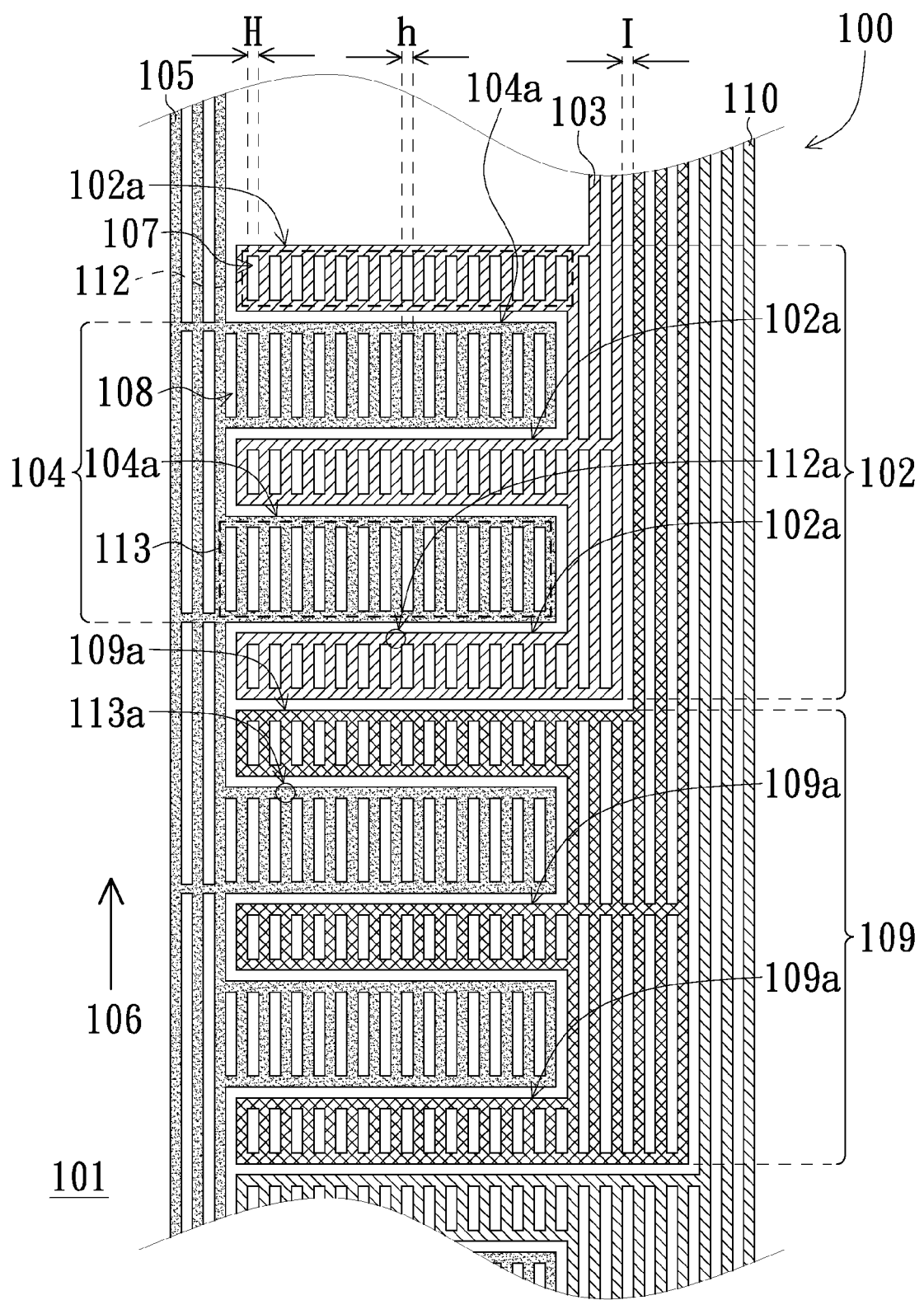
FIG. 1B is a top view of partial enlargement illustrating a portion of the capacitive touch sensor structure depicted in FIG. 1A.

FIG. 1A is a partial top-view illustrating a portion of a capacitive touch sensor structure 100 in accordance with one embodiment of the present disclosure; and FIG. 1B is a top view of partial enlargement a portion of the capacitive touch sensor structure 100 depicted in FIG. 1A, wherein the capacitive touch sensor structure 100 comprises a substrate 101, a first receiving electrode 102, a second wire 103, a first transmissive electrode 104 (also referred as an emission electrode) and a first wire 105.

The first receiving electrode 102 is disposed on the substrate 101 and has at least one second electrode 102a. The second wire 103 is disposed on the substrate 101, wherein one end of the second wire 103 is connected to a capacitive sensing chip (not shown) by a connecting line, such as a fan-out line (not shown); and the other end of the second wire 103 is connected to the second electrode 102a of the first receiving electrode 102. The first transmissive electrode 104 is disposed on the substrate 101 and has at least one first electrode 104a. The first wire 105 is disposed on the substrate 101, wherein one end of the first wire 105 is connected to the capacitive sensing chip (or namely capacitive sensing circuit, not shown) by other connecting line, such as a fan-out line (not shown); and the other end of the first wire 105 extends along a first direction 106 substantially parallel to the second wire 103 in order to connect to the first transmissive electrode 104.

In addition, the second electrode 102a has a plurality of second slits 107 substantially parallel to each other used to form a second stripe pattern 112 therein; and the first electrode 104a has a plurality of first slits 108 substantially parallel to each other used to form a first stripe pattern 113 therein.

In some embodiments of the present disclosure, the substrate 101 is made of transparent materials, such as glass, quartz, polymer, or flexible function thereof, or other suitable material thereof, or at least two combination thereof. In the present embodiment, the substrate 101 is, but not limited, made of glass.

The first receiving electrode 102, the second wire 103, the first transmissive electrode 104 and the first wire 105 are formed by patterning the same transparent conductive layer formed on the substrate 101. The transparent conductive layer may be a single layer or a multilayer structure, and materials of the transparent conductive layer include indium tin oxide (ITO), indium gallium zinc oxide (IGZO), indium gallium oxide (IGO), indium zinc oxide (IZO), indium oxide (IO), Tin oxide, zinc oxide (ZnO), aluminum oxide (AlO), Hafnium oxide ($HfO_2$) or at least two combination thereof. For the purpose of process convenience, the first receiving electrode 102, the second wire 103, the first transmissive electrode 104 and the first wire 105 formed on the substrate 101 are conformal and formed at the same horizon surface of the substrate 101. In other embodiments, at least one of the first receiving electrode 102, the second wire 103, the first transmissive electrode 104 and the first wire 105 may be formed on different horizon surfaces according to the topography of the substrate 101.

The second slits 107 of the second electrode 102a and the first slits 108 of the first electrode 104a are formed as a plurality of through holes respectively penetrating through but not cutting off the second electrode 102a and the first electrode 104a. In other words, although the second slits 107 and the first slits 108 penetrates through the second electrode 102a and the first electrode 104a respectively, both of the second electrode 102a and the first electrode 104a are still kept as a integrated block but not being divided into several separate portions by the second slits 107 and the first slits 108. For example, in the present embodiment, all stripes of the first stripe pattern 113 that are defined by the first slits 108 are connected with a connection portion 103a, so a to integrate the stripes into a block structure as the first electrode 104a; and all stripes of the second stripe pattern 112 that are defined by the second slits 107 are connected with a connection portion 112a, so as to integrate the stripes into a block as the second electrode 102a (see FIG. 1B).

In some embodiments of the present disclosure, each of the second slits 107 of the second electrode 102a may have a second width H; each of the first slit 108 of the first electrode 104a may have a first width h; and the second width H may substantially equal to or different from the first width h. In the present embodiment, preferred, the second width H and the first width h are substantially the same can be improving the above-mentioned problems.

In one embodiment of the present disclosure, the first receiving electrode 102 has another electrode identical with the second electrode 102a (thereinafter both of them are indicated by the same reference number 102a); and the first transmissive electrode 104 has another electrode identical with the first electrode 104a (thereinafter both of them are indicated by the same reference number 104a). In another embodiment of the present disclosure, the first receiving electrode 102 has more than two electrodes identical with the second electrode 102a; and the first transmissive electrode 104 has more than two electrodes identical with the first electrode 104a. In other words, the first receiving electrode 102 and the first transmissive electrode 104 may be designed to have a plurality of electrodes respectively identical with the second electrode 102a and the first electrode 104a according to the need of sensibility, wherein the electrode numbers of the first transmissive electrode 104 may be identical to or different form that of the first receiving electrode 102. For example, as shown in FIG. 1B, the first receiving electrode 102 has three electrodes and the first transmissive electrode 104 merely has two electrodes, the electrode numbers of the first transmissive electrode 104 is less than (but not limited to) that of the first receiving electrode 102.

For the purpose for enhancing the sensibility of the capacitive touch sensor structure 100, when the first receiving electrode 102 and the first transmissive electrode 104 either taken alone or in combination has a plurality of electrodes identical to the second electrodes 102a or the first electrodes 104a, the plurality of electrodes may be arranged in a staggered configuration (or namely in a staggered arrangement). For example, as shown in FIG. 1B, two of the second electrodes 102a and one of the first electrodes 104a may be arranged in a staggered configuration. In the present embodiment, each of the second electrodes 102a is connected to the second wire 103; each of the first electrodes 104a is connected to the first wire 105; and both of the second wire 103 and the first wire 105 are electrically connected to a capacitance sensing chip (not shown). During operation, applying a voltage difference between the first transmissive electrode 104 and the first receiving electrode 102; a capacitance coupling between the first transmissive electrode 104 and the first receiving electrode 102 can be kept at a predetermined value when there is no external objects in contact with the capacitive touch sensor structure 100; the capacitance coupling between the first transmissive electrode 104 and the first receiving electrode 102 can be altered when a an external object is in contact with the capacitive touch sensor structure 100; and the capacitance difference can be measured (or detected) by the capacitance sensing chip.

In one embodiment of the present disclosure, the capacitive touch sensor structure 100 further comprises at least one second receiving electrode 109 and at least one third wire 110. The second receiving electrode 109 is disposed on the substrate 101 and has at least one third electrode 109a, wherein neither the first receiving electrode 102 nor the second receiving electrode 109 is contacted to the first transmissive electrode 104. The third wire 110 is disposed on the substrate 101 and extends along the first direction 106 in order to connect to the second receiving electrode 109, wherein the second wire 103 is separated from the third wire 110 by a distance (or namely gap) I, and neither the first wire 105 nor the second wire 103 is in contact with the third wire 110.

In the present embodiment, the capacitive touch sensor structure 100 comprises a plurality of the first transmissive electrodes 104, a plurality of the first receiving electrodes 102, a plurality of the second receiving electrodes 109, a plurality of the first wire 105, a plurality of the second wire 103 and a plurality of the third wire 110 arranged in a staggered arrangement in rows and columns along X-Y axis of a plane surface to form a capacitive touch sensing array (see FIG. 1A again), wherein the first receiving electrodes 102 and the second receiving electrodes 109 could not interlace with (or crossover with) the first transmissive electrodes 104. In other words, the first receiving electrodes 102, the second receiving electrodes 109 and the first transmissive electrodes 104 are separated from each other by a lateral gap. Such that, the contact position of the external object can be accurately determined by figuring out the coordinates of the aforementioned electrodes, while the capacitance difference between the first receiving electrodes 102 and the first transmissive electrodes 104, as well as the capacitance difference between the second receiving electrodes 109 and the first transmissive electrodes 104 are measured by the capacitance sensing chip.

It is worthy to note that the second wire 103 also has a plurality of slits identical with the second slits 107 formed in the second electrode 102a (For the purpose of convenience in description, thereinafter the slits of the second wire 103 are indicated as the identical reference of 107); and the first wire 105 also has a plurality of slits identical with the first slits 108 formed in the first electrode 104a (For the purpose of convenience in description, thereinafter the slits of the first wire 105 are indicated as the identical reference of 108). Besides, the second receiving electrodes 109 and the third wire 110 further have a plurality of slits identical with the second slits 107 formed in the second electrode 102a (For the purpose of convenience in description, thereinafter the slits respectively formed in the second receiving electrodes 109 and the third wire 110 are indicated as the identical reference of 107) respectively, whereby a plurality of stripe patterns identical with the second stripe pattern 112 are respectively formed in the second receiving electrodes 109 and the third wire 110 (For the purpose of convenience in description, thereinafter stripe patterns respectively formed in the second receiving electrodes 109 and the third wire 110 are indicated as the identical reference of 112).

To solve the problems of uneven transmittance due to the contours or residue shadow of the electrodes and wires, the third wire 110 is separated from the second wire 103 by a distance I, preferably, substantially equal to the first width h of the first slits 108 and the second width H of the second slits 107. In the present embodiment, the distance I separating the third wire 110 and the second wire 103 is substantially greater than 0 μm and less than or substantially equal to 10 μm.

Since the regular arrangement of the second stripe pattern 112 and the first stripe pattern 113 that are formed in the patterned transparent conductive layer used for forming the first receiving electrode 102, the second wire 103, the first transmissive electrode 104, the first wire 105, the second receiving electrode 109 and the third wire 109 may result in a visual effect to make the user ignoring the contours or the residue shadow of the irregularly arranged electrodes and wires. As a result, the display performance of the electrical apparatus that applying the capacitive touch sensor structure 100 can be improved significantly.

The display performance of the electrical apparatus can be further improved by considering the trade off between the width of the slits (such as the width h of the first slits 108 and the width H of the second slits 107) and the thickness of the transparent conductive layer for forming the first receiving electrode 102, the second wire 103, the first transmissive electrodes 104, the first wire 105, the second receiving electrode 109 and the third wire 109. Several embodiments using an ITO layer as the transparent conductive layer are provided and testes for optimizing the thickness of the transparent conductive layer and the slit width to improve the sensitivity and the transmittance of the capacitive touch sensor structure 100 under a prerequisite of without deteriorating of the display performance of the electrical apparatus are performed. The embodiments and the testing results are provided as follows:

TABLE 1

| Thickness of the ITO layer (Å) | Sheet resistance of the ITO layer (ohm/square) | Slit width H = h (μm) | visual effect |
| --- | --- | --- | --- |
| 300 | 140~170 | <10 | Y |
| | | 10~30 | Y |
| | | 30~60 | Y |
| | | >60 | N |
| 600 | 80~110 | <10 | Y |
| | | 10~30 | Y |
| | | 30~60 | N |
| | | >60 | N |
| 900 | 60~80 | <10 | Y |
| | | 10~30 | N |
| | | 30~60 | N |
| | | >60 | N |
| 1200 | 30~50 | <10 | Y |
| | | 10~30 | N |
| | | 30~60 | N |
| | | >60 | N |

Table 1 illustrates the sensitivity (indicated by the sheet resistance of the ITO layers) and the visual effect (including transmittance) of different capacitive touch sensor structures in which different ITO layers with various thicknesses are used as the transparent conductive layer for forming the first receiving electrode 102, the second wire 103, the first transmissive electrodes 104, the first wire 105, the second receiving electrode 109 and the third wire 110 are provided serving as the criteria for optimizing the thickness of the transparent conductive layer and the slit width.

In accordance with Table 1, the capacitive touch sensor structure 100 that has the same slit width (i.e. the first width h is equal to the second width H) greater than 0 μm and less than or equal to 10 μm has better sensitivity and the transmittance than other capacitive touch sensor structures. Thus, it is preferable (but not limited) to make the slit width h of the first slits 108 substantially equal to the slit width H of second slits 107 as example. However, it is worthy to note that even if the slit width h of at least parts of the first slits 108 substantially is not equal to the slit width H of second slits 107, in some other embodiments, the sensitivity and the visual effect of the capacitive touch sensor structure 100 is still rather good, when the slit width h of the first slits 108 and the slit width H of second slits 107 are controlled in a rage of greater than 0 μm and less than or equal to 10 μm.

In the present embodiment, at least one of the first receiving electrode 102, the second wire 103, the first transmissive electrodes 104, the first wire 105, the second receiving electrode 109 and the third wire 110 are is rectangle shaped as example. However in some other embodiments, at least one of the shapes of the first receiving electrode 102, the second wire 103, the first transmissive electrodes 104, the first wire 105, the second receiving electrode 109 and the third wire 110 may be curviform, triangle, polygonal-shape, zigzag, circle or a combination thereof. Nevertheless there are various shapes for selection, the most important thing, in accordance with the Table 1, is to control the slit width h of the first slits 108 and the slit width H of second slits 107 in a rage of greater than 0 μm and less than or equal to 10 μm.

Figure 2A:
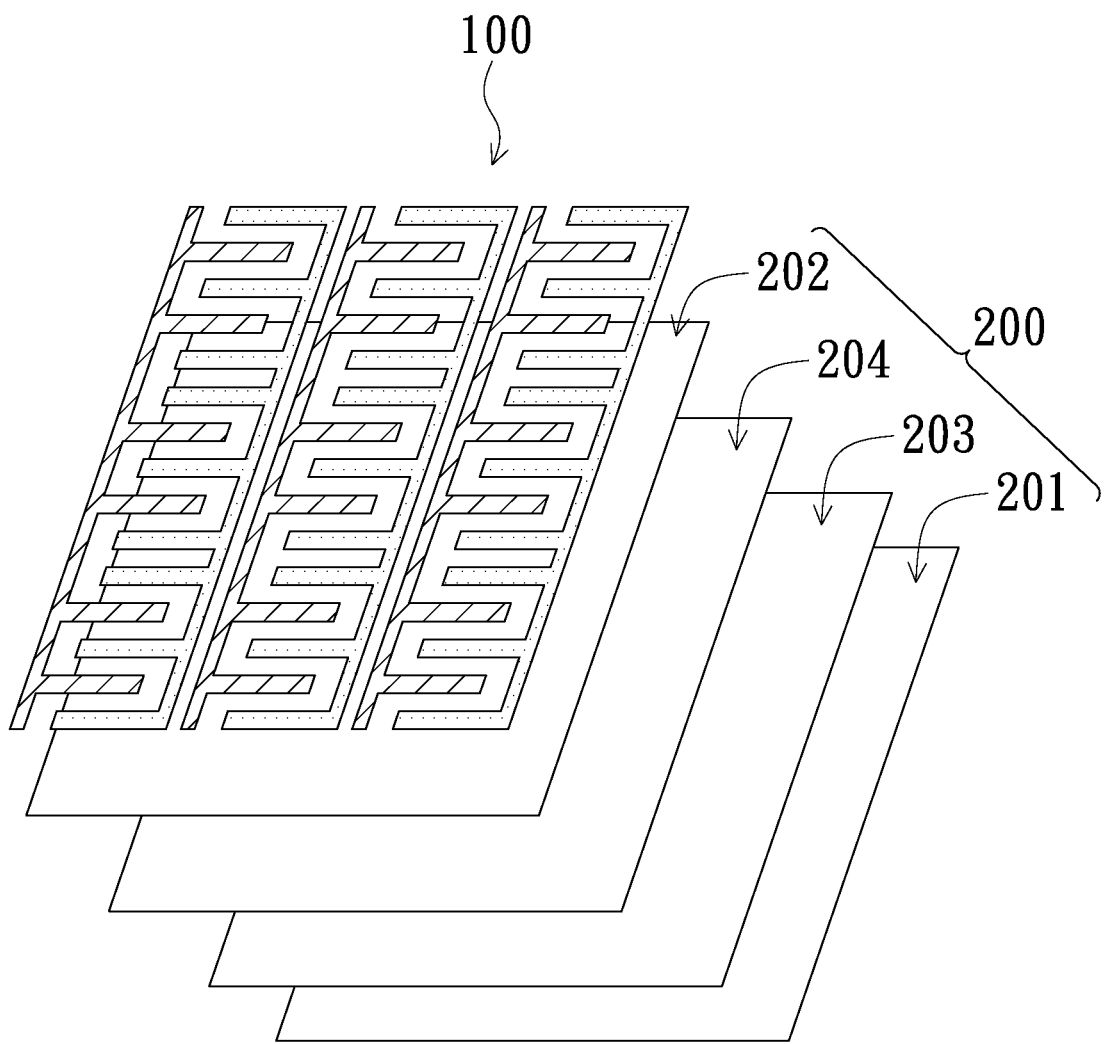
FIG. 2A is a exploded view illustrating a portion structure of a touch panel in accordance with one embodiment of the present disclosure.
Figure 2B:
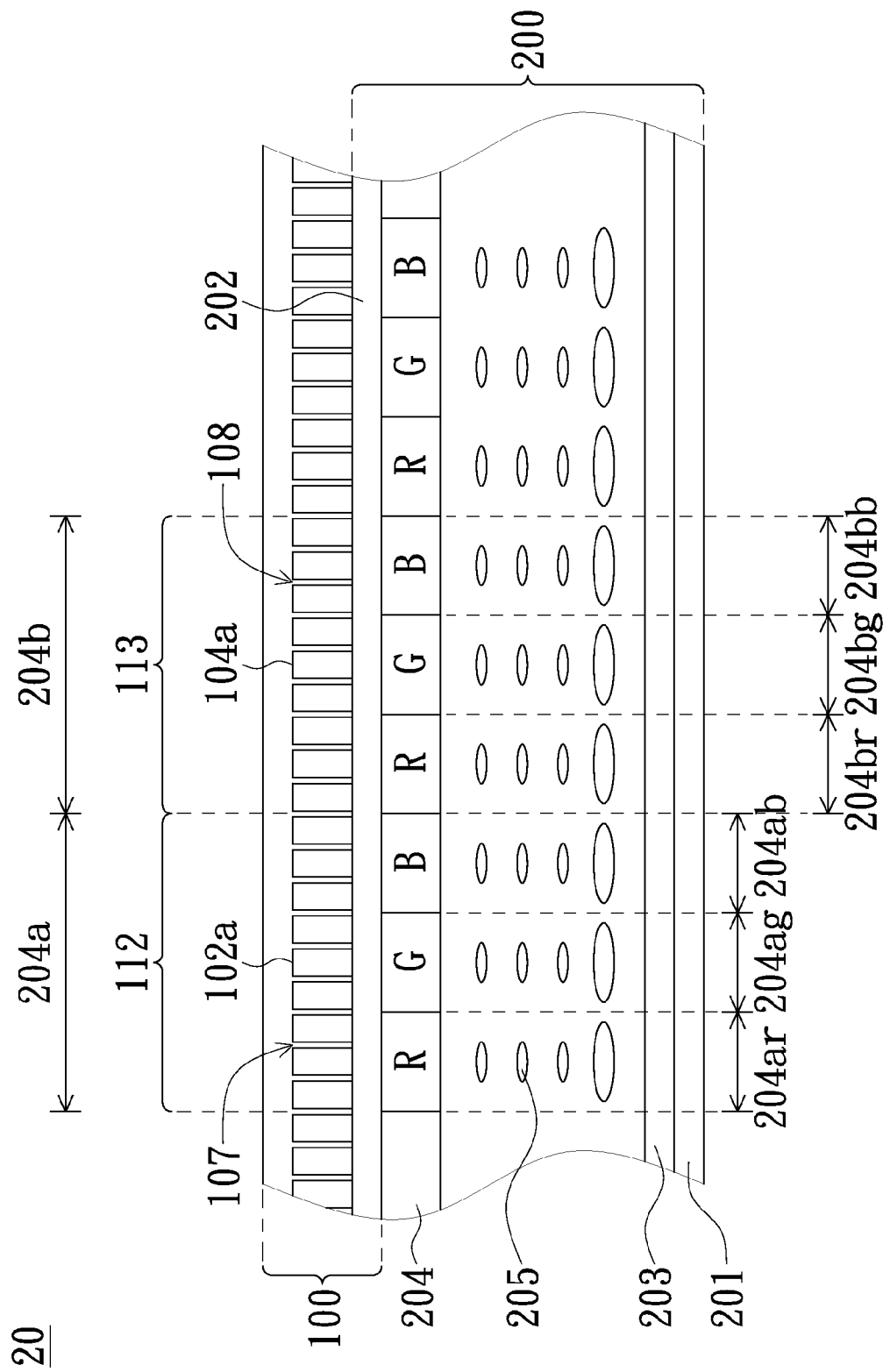
FIG. 2B is a cross view illustrating a portion structure of the touch panel depicted in FIG. 2A.

The capacitive touch sensor structure 100 of the aforementioned embodiments can be associated with a display unit to form a touch panel, a display with touch control functions. FIG. 2A is a exploded view illustrating a portion structure of a touch panel 20 in accordance with one embodiment of the present disclosure. FIG. 2B is a cross view illustrating a portion structure of the touch panel 20 depicted in FIG. 2A. In the present embodiment, a display panel 200 is used to serve as the display unit associated with the capacitive touch sensor structure 100 to form the touch panel 20, wherein the display panel 200 comprises a first substrate 201, a second substrate 202 and a display medium layer 205 disposed between the first substrate 201 and the second substrate 202. The display panel 200 further comprises a thin film transistor (TFT) layer 203 used to control the optical electro-optic effect of the display medium layer 205. In addition, the display panel 200 may selectively comprise a color filter 204 disposed between the first substrate 201 and the second substrate 202. In the present embodiment, as shown in FIGS. 2A and 2B, the color filter 204 is disposed between the second substrate 202 and the display medium layer 205 such as the color filter 204 is disposed on inner surface of the second substrate 202 as example, but not limited. In some other embodiments, the color filter 204 may alternatively disposed between the first substrate 201 and the display medium layer 205. Suitable arrangements of the color filter 204 may comprise a color filter on array design (COA) or an array on color filter design (AOC). On the one hand, the color filter on array design is to dispose the color filter 204 over the TFT layer 203 and between the TFT layer 203 and the display medium layer 205. On the other hand, the array on color filter design is to dispose the color filter 204 under the TFT layer 203 and between the TFT layer 203 and the first substrate 201. The TFT layer 203 comprises a plurality of transistors, such as bottom gate thin film transistors, top gate thin film transistor, or other suitable type transistors. The transistor has a semiconductor layer configured in a single layer or multi-layers, and the materials of the semiconductor layer include amorphous silicon, polysilicon, single crystal silicon, microcrystalline silicon, oxide semiconductor, organic semiconductors or other suitable materials. In the embodiments of the present disclosure. The display medium layer 205 of the display panel 200 comprises non-self-lighting materials (e.g. liquid crystal materials, electrowetting materials, electrophoresis materials, other suitable materials, or a combination thereof) and self-lighting material (e.g. organic light emitting materials, inorganic light emitting materials, other suitable materials, or a combination thereof). In the present embodiment, the display medium layer 205 comprises a liquid crystal of non-self-lighting materials, but not limited it; and the materials consisting of the first substrate 201 and the second substrate 202 may be selective the abovementioned materials of the substrate 101.

The capacitive touch sensor structure 100 is disposed on and overlaps with an outer surface of the second substrate 202 of the display panel 200 as a preferred embodiment such as the second substrate 202 may serve as the substrate 101 of the capacitive touch sensor structure 100. In other words, the capacitive touch sensor structure 100 is directly formed on the second substrate 202 of the display panel 200, but not limited it. In other embodiments, the capacitive touch sensor structure 100 may be formed on inner surface of the second substrate 202 or the capacitive touch sensor structure 100 firstly formed on a substrate 101 and then is assembled on either an outer surface of the first substrate 201 or an outer surface of the second substrate 202.

The display panel 200 comprises a plurality of sub-pixels, at least three of the sub-pixels can constitute one pixel, and each of the sub-pixels includes at least one transistor and the color filter 204 has at least one color. In the present embodiment, each pixel of the display panel 200 is constituted by three sub-pixels with different colors including red (R), green (G) and blue (B), but not limited it. However, in some other embodiments of the present disclosure, each pixel of the display panel 200 may constituted two, four, five, six, or more sub-pixels, and colors of each pixels can be selected from a color coordination (or namely CIE Chromaticity Coordinates) such as white, yellow, purple, brown, orange, or like.

In the present embodiment, the display panel 200 has a plurality of pixels 204a and 204b, wherein the pixel 204a is constituted by three sub-pixels 204ar, 204ag and 204ab. At least one of the three sub-pixels 204ar, 204ag and 204ab, for example the sub-pixel 204ar, overlaps with a portion of the second electrode 102a of the first receiving electrode 102. The pixel 204b is constituted by three sub-pixels 204br, 204bg and 204bb. At least one of the three sub-pixels 204br, 204bg and 204bb, for example the sub-pixel 204br, overlaps with a portion of the first electrode 104a of the first transmissive electrodes 104. To solve the aforementioned problems, the second stripe pattern 112 overlapped by one of the three sub-pixels 204ar, 204ag and 204ab, for example the sub-pixel 204ar, may have an area substantially equal to that of the first stripe pattern 113 overlapped by one of the three sub-pixels 204br, 204bg and 204bb, for example the sub-pixel 204br (see FIG. 2C).

Figure 2C:
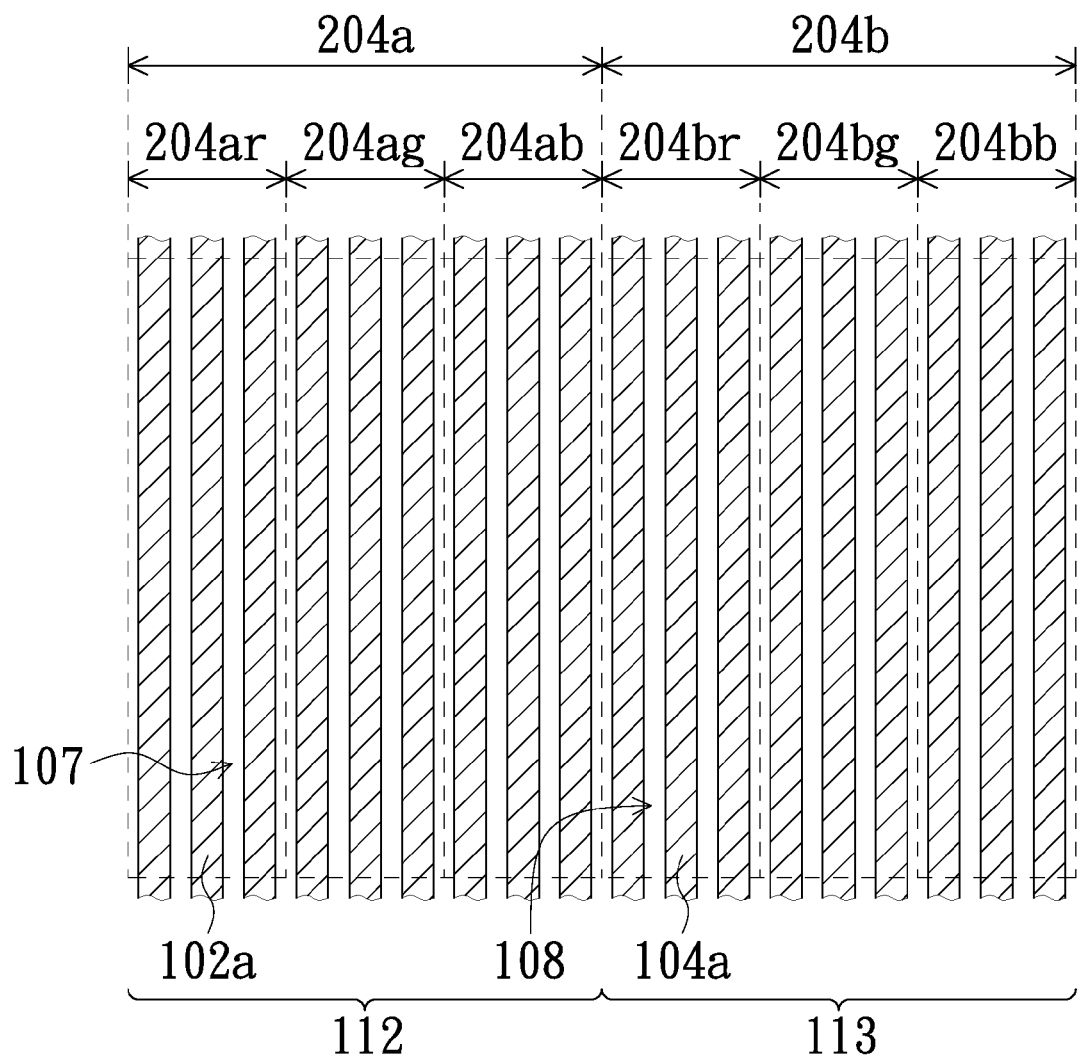
FIG. 2C is a top view of partial enlargement illustrating a portion of the touch panel depicted in FIGS. 2A and 2B.

Similarly, the second stripe pattern 112 that is formed in at least one of the second wire 103 and the third wire 110 and overlapped by one of the three sub-pixels 204ar, 204ag and 204ab, for example the sub-pixel 204ar, may has a area substantially equal to that of the first stripe pattern 113 formed in the corresponding first wire 105 and overlapped with one of the three sub-pixels 204br, 204bg and 204bb, for example the sub-pixel 204br (see FIG. 2C). In the embodiments of the present disclosure, each of the sub-pixels means a pixel electrode (not shown) on the substrate 101 to formed a region, and the pixel electrode is connected to at least one transistor of the TFT layer 203 of the display panel 200. In other words, each of the sub-pixels has a corresponding sub-pixel electrode.

It should be appreciated that at least one of the sub-pixels in the pixel 204a and 204b may overlap with only one single electrode, respectively. However, in some other embodiments, only one the sub-pixels involved in the pixel 204a and 204b may overlap with two or more of the first electrode 104a, the second electrode 102a, the third electrode 109a, the first wire 105, the second wire 103 and the third wire 110. Such that, only one sub-pixel may overlap with the first stripe patterns 113 and the second stripe patterns 112 respectively formed in those corresponding electrodes and wires.

In some embodiments, when only one sub-pixel overlap with two or more electrodes and wires, the total area of the first stripe patterns 113 and the second stripe patterns 112 overlapped by the only one sub-pixel may be substantially equal to the total area of the first stripe patterns 113 and the second stripe patterns 112 overlapped by another sub-pixel. In other words, the total area of the portion of the patterned transparent conductive layer overlapped by each of the sub-pixels is substantially identical to that overlapped by one another.

Accordingly, the first width h, the second width H and the distance I between the second wire 103 and the third wire 110 can be determine by considering the rules concluded from the above testing result and the actual size of the sub-pixels. In some embodiments of the present disclosure, at least two of the first width h, the second width H and the distance I are the same each other. In a preferred embodiment, all of the first width h, the second width H and the distance I are the same each other. In the present embodiment, at least two of the first width h, the second width H and the distance I are substantially greater than 0 μm and less than or substantially equal to 10 μm; and preferably all of the first width h, the second width H and the distance I are substantially greater than 0 μm and less than or substantially equal to 10 μm.

Since the regular arrangement of the second stripe pattern 112 and the first stripe pattern 113 associated with the sub-pixels overlaps therewith may result in a visual effect to make the user ignoring the contours or the residue shadow of the irregularly arranged electrodes and wires of the capacitive touch sensor structure 100. As a result, the display performance of the touch panel 20 that applying the capacitive touch sensor structure 100 can be improved significantly.

In sum, a plurality of first slits and a plurality of second slits extending along a predetermined direction substantially parallel to the second wire are respectively formed in the first transmissive electrode and the first receiving electrode to form a stripe pattern with a regular interval, whereby a special visual effect is resulted from the first slits and the second slits both substantially parallel to the second wire to make the user ignoring the contours or the residue shadow of the first transmissive electrode and the first receiving electrode. Such that the problems of uneven transmittance due to the residue shadow of the first transmissive electrode and the first receiving electrode can be obviate, and the display performance of the electrical apparatus applying the capacitive touch sensor structure can be significantly improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A capacitive touch sensor structure comprising:
a substrate;
a first transmissive electrode, disposed on the substrate and having at least one first electrode;
a first wire, disposed on the substrate and connected to the first electrode of the first transmissive electrode;
a first receiving electrode, disposed on the substrate and having at least one second electrode; and
a second wire, disposed on the substrate and extending along a first direction to connect to the first receiving electrode;
wherein the first electrode has a plurality of first slits and the second electrode has a plurality of second slits, neither the first receiving electrode nor the second wire is in contact with the first transmissive electrode, and the first wire is not in contact with the second wire.

2. The capacitive touch sensor structure according to claim 1, wherein the first wire further comprises the first slits, and the second wire comprises the second slits.

3. The capacitive touch sensor structure according to claim 2, wherein each of the first slits and each of the second slits have a substantially the same width.

4. The capacitive touch sensor structure according to claim 3, wherein the substantially the same width of the first slits and the second slits is greater than 0 .mu.m and substantially equal to or less than 10 .mu.m.

5. The capacitive touch sensor structure according to claim 3, further comprising: a second receiving electrode, disposed on the substrate and having at least one third electrode, wherein neither the second receiving electrode nor the first transmissive electrode is in contact with the first receiving electrode; and a third wire, disposed on the substrate and extending along the first direction to connect to the second receiving electrode, wherein the second wire is separated from the third wire by a distance, and neither the first wire nor the second wire is in contact with the third wire.

6. The capacitive touch sensor structure according to claim 5, wherein both of the third wire and the second wire further comprises the second slits respectively.

7. The capacitive touch sensor structure according to claim 6, wherein the distance separating the second wire and the third wire is substantially equal to the substantially the same width of the first slits and the second slits.

8. The capacitive touch sensor structure according to claim 6, wherein the distance separating the second wire and the third wire is greater than 0 .mu.m and substantially equal to or less than 10 .mu.m.

9. The capacitive touch sensor structure according to claim 1, wherein the first transmissive electrode has a plurality of the first electrodes connected to the first wire.

10. The capacitive touch sensor structure according to claim 1, wherein the plurality of the first electrodes and the at least one second electrode are arranged in a staggered configuration.

11. The capacitive touch sensor structure according to claim 1, wherein the first slits and the second slits extend along the first direction.

12. The capacitive touch sensor structure according to claim 1, wherein the first slits and the second slits both are substantially parallel to the second wire.

* * * * *